US006362071B1

(12) United States Patent
Nguyen et al.

(10) Patent No.: US 6,362,071 B1
(45) Date of Patent: Mar. 26, 2002

(54) METHOD FOR FORMING A SEMICONDUCTOR DEVICE WITH AN OPENING IN A DIELECTRIC LAYER

(75) Inventors: Bich-Yen Nguyen, Austin; William J. Taylor, Jr., Round Rock; Philip J. Tobin, Austin; David L. O'Meara, Austin; Percy V. Gilbert, Austin; Yeong-Jyh T. Lii, Austin; Victor S. Wang, Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/542,706

(22) Filed: Apr. 5, 2000

(51) Int. Cl.[7] ............................................. H01L 21/76
(52) U.S. Cl. ..................... 438/416; 438/706; 438/238
(58) Field of Search .......................... 438/40, 43, 640, 438/673, 701, 713, 979

(56) References Cited

U.S. PATENT DOCUMENTS

| 6,010,930 A | * | 1/2000 | Keller et al. ................ 438/238 |
| 6,060,385 A | * | 5/2000 | Givens ........................ 438/626 |
| 6,207,517 B1 | * | 3/2001 | Muller ........................ 438/301 |
| 6,207,577 B1 | * | 3/2001 | Wang et al. ................. 438/706 |

OTHER PUBLICATIONS

John M. Sherman et al., "Elimination of the Sidewall Defects in Selective Epitaxial Growth (SEG) of Silicon for a Dielectric Isolation Technology", IEEE Electron Device Ltrs., vol. 17, No. 6, Jun. 1996, pp. 267–269.

Hua–Chou Tseng et al., "Effects of Isolation Oxides on Undercut Formation and Electrical Characteristics for Silicon Selective Epitaxial Growth", J. Electrochem. Soc., vol. 144, No. 6, Jun. 1997, pp. 2226–2229.

Atsushi Hori et al., "A Novel Isolation Technology Utilizing Si Selective Epitaxial Growth", Electronics and Communications in Japan, Part 2, vol. 79, No. 12, 1996, 1997 Scripta Technica, Inc., pp. 40–46.

John C. Hughes et al., "Effects of Epitaxial Silicon Technology on the Manufacturing Performance of Wafer Fabrication Lines", 1998 IEEE/CPMT Int'l. Electronics Manufacturing Technology Symposium, pp. 333–334.

* cited by examiner

Primary Examiner—David Nelms
Assistant Examiner—Dung A Le
(74) Attorney, Agent, or Firm—Robert A. Rodriguez

(57) ABSTRACT

In accordance with one embodiment of the present invention, a method is disclosed for forming a semiconductor device having an isolation region (601). A dielectric layer (108) is deposited and etched to form isolation regions (102, 605) having top portions that are narrower than their bottom portions, thereby a tapered isolation region is formed. Active regions (601, 603) are formed using an epitaxial process in the regions between the isolation regions. The resulting active regions (601, 603) have a greater amount of surface area near a top portion, than near a bottom portion. Transistors (721, 723) having opposite polarities are formed within the active areas.

20 Claims, 7 Drawing Sheets

METHOD FOR FORMING A SEMICONDUCTOR DEVICE WITH AN OPENING IN A DIELECTRIC LAYER

FIELD OF THE INVENTION

The present invention deals generally with the formation of isolation regions, and more specifically to the formation of sloped isolation regions in semiconductor devices.

BACKGROUND OF THE INVENTION

In the semiconductor industry, the purpose of isolation regions is to isolate active areas that contain N-channel transistors from active areas that contain P-channel transistors. It is well known in the existing art that isolation regions prevent current flow between doped source/drain regions of a transistor and the well or substrate, having a similar doping, that is associated with an adjacent transistor. For example, the potential for leakage occurs when the P-doped region of a P-channel transistor is biased with respect to the adjacent P-well of an adjacent N-channel transistor.

One known method of forming the isolation regions is through the use of trench isolation technology. Trench isolation technology etches into the silicon substrate to form a trenched region. Within the trench region an isolation oxide is deposited. The isolation oxide provides isolation between active regions.

The overall quality of devices, which includes leakage that occurs at the junction between devices, can be affected by the shape of the trench isolation region. For example, an isolation trench having substantially vertical sidewalls is susceptible to the formation of keyhole voids during subsequent oxide filling of the trench. Such keyholes (voids) cause reliability issues and are not acceptable for formation of semiconductor devices.

The use of tapered trench isolation regions reduces the effects of keyholes during the formation of isolation trench regions. Specifically, tapered isolation trenches are formed having a larger opening at their top (nearer the substrate surface), and a smaller opening at their bottom to reduce the keyhole effects. However, tapering of the isolation region from wider at the surface to narrower at the bottom makes devices more susceptible to leakage between adjacent wells and junctions. Because of the tapering, a reduced distance between the adjacent well and the junction results in a greater susceptibility to leakage. Furthermore, when the device is scaled, the depth of the isolation trench must also be reduced to maintain the same aspect ratio of the trench, thereby further minimizing the distance between the junction and the adjacent well and further aggravating the leakage problem. Another drawback of tapered trenches is that they reduce the packing density of devices on a wafer.

Another known method for reducing the effects of keyholes is to reduce the trench depth. Processes can more readily form oxide isolation regions without the problem of keyholes by reducing the aspect ratio of the isolation trench. However, reducing the isolation trench depth also decreases the distance between the junction and the adjacent well. As mentioned previously, if more aggressive design rules are implemented, the trench depth must be scaled proportionally to maintain substantially the same aspect ratio to limit keyholes.

Therefore, a method and/or device capable of providing improved isolation between active regions would be beneficial.

BRIEF DESCRIPTION OF THE DRAWINGS

The present invention is illustrated by way of example, and not limitation, in the accompanying figures, in which like references indicate similar elements, and in which.

Skilled artisans appreciate that elements in the figures are illustrated for simplicity and clarity and have not necessarily been drawn to scale. For example the dimensions of some of the elements in the figures may be exaggerated relative to other elements to help improve the understanding of the embodiments of the present invention.

DETAILED DESCRIPTION

In accordance with one embodiment of the present invention, a method is disclosed for forming a semiconductor device having an isolation region. A dielectric layer is deposited and etched to form isolation regions having top portions that are narrower than their bottom portions, thereby a tapered isolation region is formed. An active region is formed using an epitaxial process in the regions between the isolation regions. The resulting active areas have a greater amount of surface area near a top portion, than near a bottom portion. The resulting structure is less susceptible to leakage between adjacent active areas and/or their associated wells, as compared to previously known structures.

Figure 1:
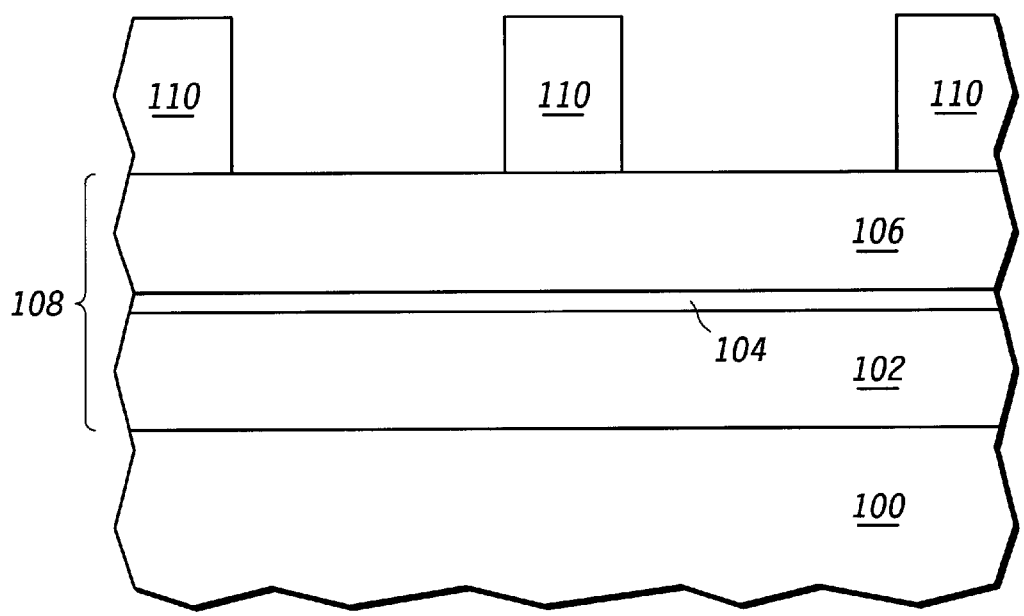
FIGS. 1–8 illustrate, in cross section, a sequence of semiconductor structures used in forming an isolation region in accordance with the present invention.

FIG. 1 illustrates a region comprising the substrate 100, dielectric layer or film 108, and a patterned photoresist layer or film 110.

The substrate 100 can include a monocrystalline silicon, silicon on insulator (SOI), gallium nitride, gallium arsenide, indium gallium arsenide, indium phosphide, or any other semiconductor or compound semiconductor substrate.

The dielectric layer 108 can include a single layered or composite layered dielectric region. For example, the entire region 108 may be a single layer formed of a thermally grown silicon oxide, or a chemical vapor deposition (CVD) deposited silicon oxide. The specific embodiment illustrated in FIG. 1 illustrates the dielectric region 108 as a multi-layered composite dielectric region including layers or films 102, 104, and 106. In one embodiment, the layers 102 and 106 are a thermally grown silicon oxide or CVD deposited oxide, while the layer 104 is a stop layer for CMP or etch.

The stop layer in a specific embodiment acts as a chemical-mechanical polish (CMP) stop layer. Specific implementations of a CMP stop layer include silicon nitride, or aluminum oxide, or any other layer that is selectable to a CMP process.

Figure 2:
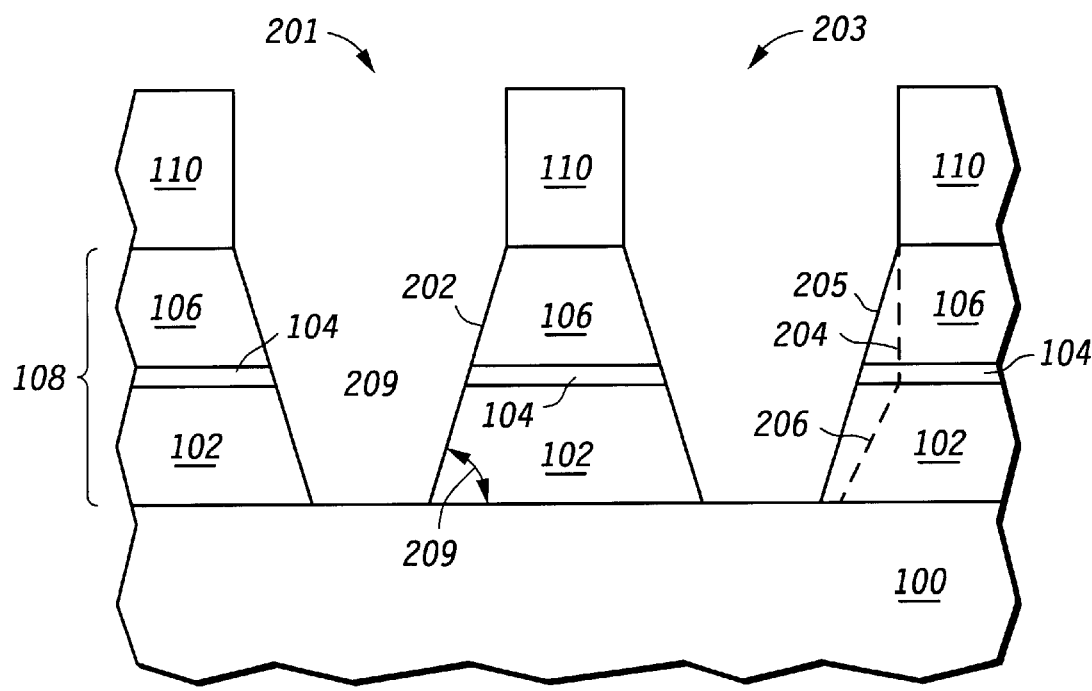

FIG. 2 illustrates the region of FIG. 1 following a tapered etch of the dielectric layer 108 that forms openings 201 and 203. In a first embodiment, the etch profile is tapered from the junction of the photoresist 110 and dielectric region 108 down to the surface of the substrate 100. This etch profile includes the sidewalls 202 and 205. The angle 209, which is the angle between the primary substrate 100 surface and the side wall 202, is less than 90 degrees, and will generally be approximately 80–60 degrees. In an alternate etch profile, the first trench wall portion 204 is vertical through the dielectric layer 106, while a second trench wall portion 206 is tapered through the dielectric region 102.

In order to obtain a trench profile as represented by the walls 202 and 205, an etch process utilizing a carbon and fluorine containing gas along with oxygen can be used. The introduction of oxygen with the carbon and fluorine containing gas results in a resist erosion, which facilitates the formation of the tapered, etch profile of walls 202 and 205. Specific examples of carbon and fluorine containing gases capable of being used include $CHF_3$, $CF_4$, $C_2F_6$, $C_3F_8$, and $C_4F_8$.

In a specific implementation, Applied Materials Centura 5200 MxP+dielectric etch chamber is used to form the trenches with a process condition of 1100 W, 200 mtorr, 30 gauss, 50 sccm $CHF_3$, 10 sccm $O_2$, 50 sccm Ar.

Figure 3:
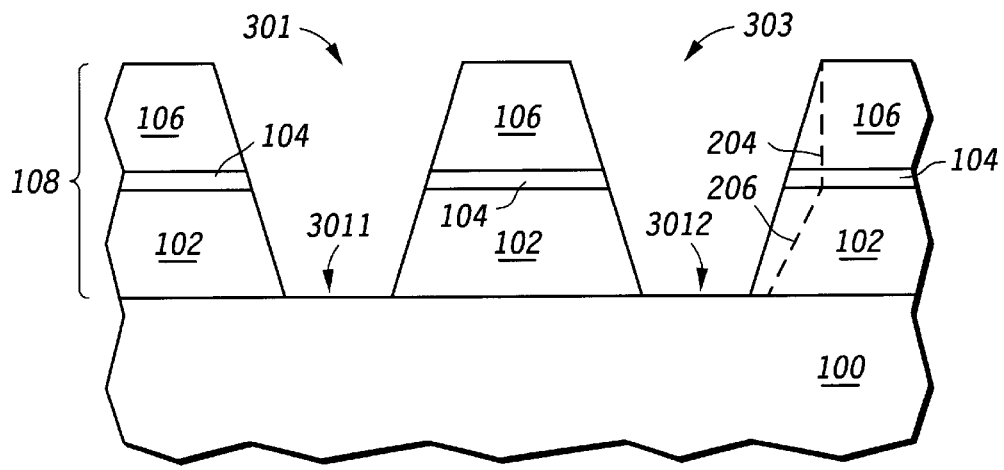
Figure 4:
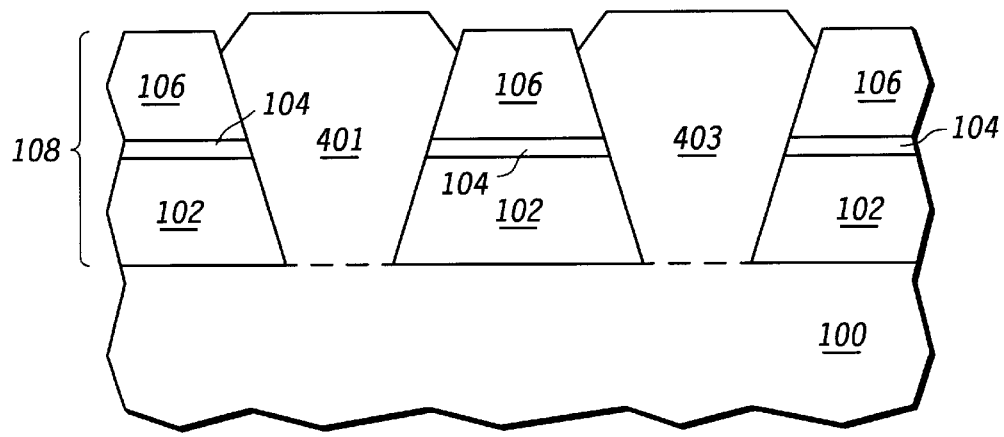

FIG. 3 illustrates the region following the removal of the photoresist layer 110. The remaining structure includes openings 301 and 303 having exposed silicon regions 3011 and 3012 respectively. The exposed silicon regions 3011 and 3012 act as seed layers for subsequent epitaxial growth, and may be subject to cleaning steps prior to the formation of the epitaxial regions FIG. 4 illustrates the region of FIG. 3 following the formation of epitaxial regions 401 and 403. A single or compound semiconductor material, that may be doped or undoped, forms the epitaxial regions 401 and 403. For example, in specific embodiments, the epitaxial regions 401 and 403 can include silicon, gallium nitride, gallium arsenide, indium gallium arsenide, and indium phosphide. Epitaxial regions 401 and 403 can be formed from different materials, using multiple epitaxial processes. For example, epitaxial region 401 may be formed from silicon, while epitaxial region 403 is formed from a silicon-germiianiium material. Furthermore, the regions 401 and 403 have substantially the same single crystalline semiconductor structure as the underlying substrate 100. For example, the epitaxial regions 401 and 403 will have essentially the same orientations as the underlying substrate 100. The facets seen at the top corners of epitaxial regions 401 and 403 are, in general, an unavoidable consequence of the epitaxial growth process, and are, in general, undesirable.

In accordance with a specific embodiment, the epitaxial regions 401 and 403 can be grown with or without a dopant. For example, where doped silicon is desired the epitaxial region 401 can be grown using an N-doped epitaxial process, while the epitaxial region 403 is grown using a P-doped epitaxial process.

One skilled in the art will recognize that the epitaxial regions 401 and 403 can represent single element homogeneous regions, or in alternate embodiments, can be grown to form composite element regions having varying degrees of doping and/or composition layers as desired.

In an embodiment where the dielectric layer 108 includes the layered regions 102, 104 and 106, the epitaxial regions 401 and 403 will be grown beyond the stop layer 104 to facilitate subsequent removal of a portion of the regions 401 and 403 back to the stop layer 104. Growing epitaxial regions 401 and 403 beyond the top of the stop layer 104 provides a mechanism to control defects which result at the surface of the regions 401 and 403. In an alternate embodiment where the dielectric region 108 is a uniform dielectric throughout, the epitaxial regions 401 and 403 will be grown to a thickness greater than a desired final thickness to accommodate a subsequent polishing step.

Figure 5:
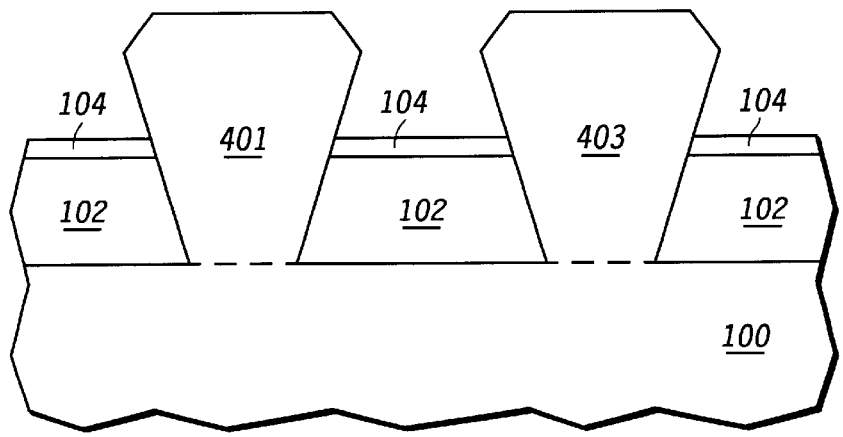

FIG. 5 illustrates the structure of FIG. 4 following an etch removal of the upper dielectric layer 106. The resulting structure results in the epitaxial regions 401 and 403 extending beyond the surface of the etch stop layer 104. In specific embodiments, the thickness of the now removed dielectric region 106 will be approximately, but not limited to, one third the thickness of the underlying dielectric layer 102, in order to support the growth of the epitaxial regions 401 and 403 beyond the top of this etch stop layer 104 to an appropriate thickness, while limiting subsequent stresses associated with the polishing of the structures 401 and 403. In another embodiment, the etch of dielectric layer 106 illustrated in FIG. 5 is optional. Instead, the dielectric layer 106 is left to be removed bit the polishing step describe with reference to FIG. 6.

Figure 6:
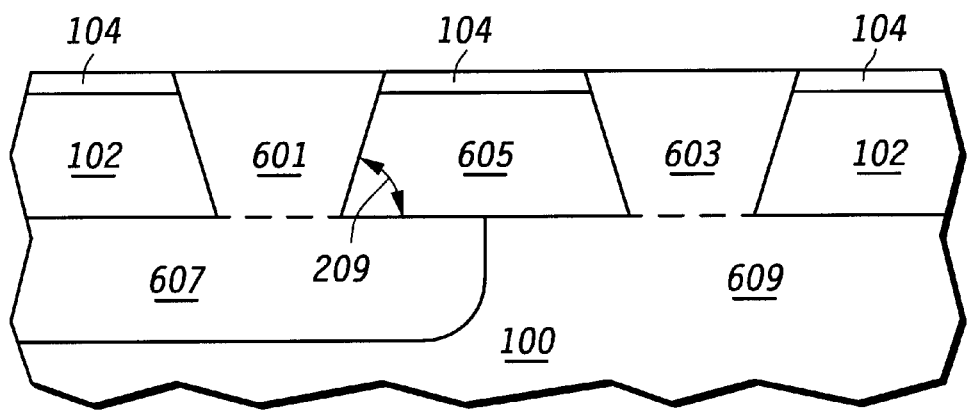

FIG. 6 illustrates the structure of FIG. 5. following a subsequent CMP polishing step. The resulting polished wafer illustrated in FIG. 6 can be accomplished utilizing conventional silicon polishing techniques, and is advantageous because the CMP polishing step removes the facets discussed with respect to FIG. 4.

The remaining epitaxial regions 601 and 603, which are separated by isolation region 605, now represent active regions to be used for the formation of transistor devices. Generally, the epitaxial layer 601 and 603 will have a thickness of approximated 200 to 500 nm. Also illustrated in FIG. 6 is a well region 607. In one embodiment, the well region 607 is formed subsequent to the polishing step. For example, well 607 can represent a P-well diffused into an N-substrate. In other embodiments, where the epitaxial region 601 was grown as a P-doped epitaxial region, the formation of a well region 607 within the substrate 100 may be omitted. In yet another embodiment, dopants incorporated within the epitaxial regions 601 and 603 can be outdiffused to the substrate 100 during subsequent process anneals.

Figure 7:
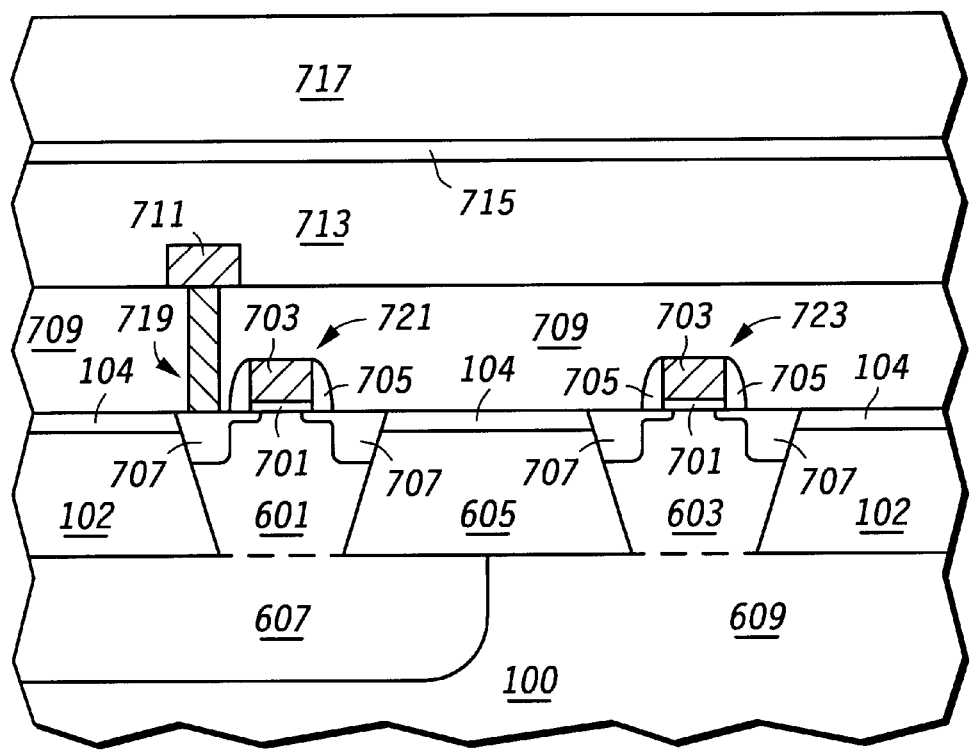

FIG. 7 illustrates one example of a completed semiconductor device including transistors 721, 723 formed within the active regions 601 and 603 respectively. Specifically, FIG. 7 illustrates transistors 721 and 723 having gate dielectric regions 701, gate electrode 703, side wall portions 705, and doped regions 707. Forming a contact to one of the doped regions 707 of transistor 721 is a conductive contact 719. The conductive contact 719 is formed through an interlayer dielectric 709. Conductive interconnect 711 conductively connects to contact 719. The conductive interconnect 711 is formed within the interlayer dielectric 713. Formed over the interlayer dielectric layer 713 is a passivation layer 715. Formed over the passivation layer 715 is a polyimide layer 717. The formation of structure illustrated in FIG. 7 would be known to those of ordinary skill in the art.

Figure 11:
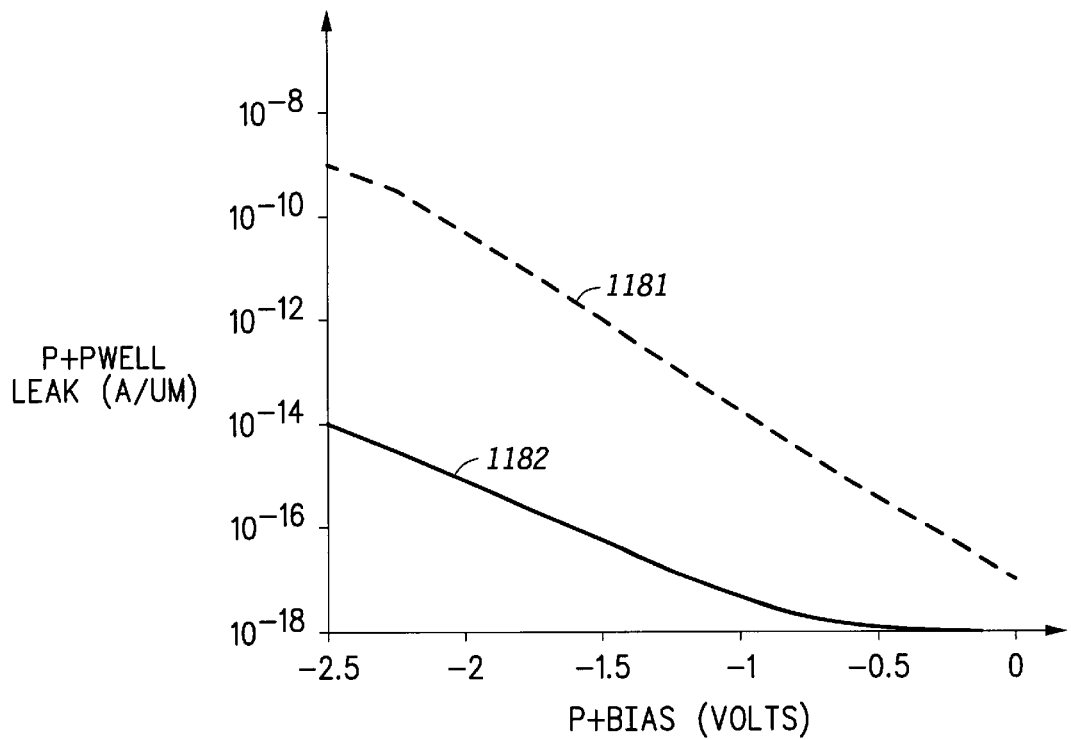
FIGS. 11–13 illustrate, in graphical form, curves representing leakage current in accordance with the present invention and of previously known isolation regions.

One advantage associated with the device of FIG. 11, is that an increased active surface area is realized for the same amount of wafer surface area, as compared to active areas formed by prior know isolation techniques. The increased active area permits subsequent processing dimensions to be relaxed, resulting in improved processing. Examples of improved processing would include the ability to form a larger contact 719, thereby reducing the contact resistance between 719 and the doped region 707 of the substrate, or allowing for less critical alignment requirements of the contact 719 to the doped region 707.

In an alternate embodiment, one of the epitaxial regions 601 or 603 can act as a well tie, instead of an active region for formation of a transistor. This is advantageous over the prior art, in that the active regions of 601 and 603 provide for a larger contact area to support formation of a conductive region contact to the well tie.

Figure 8:
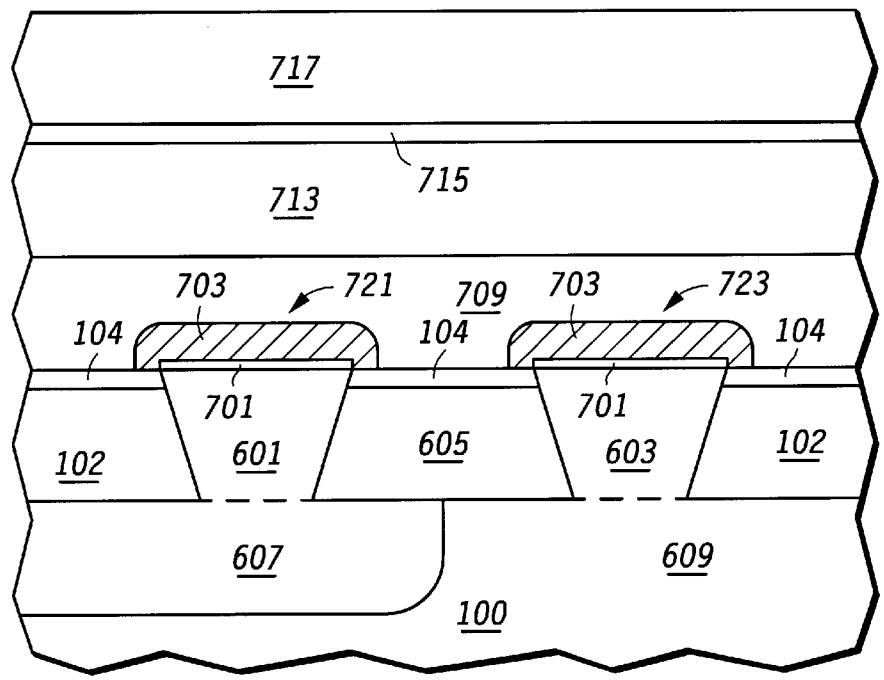
Figure 9:
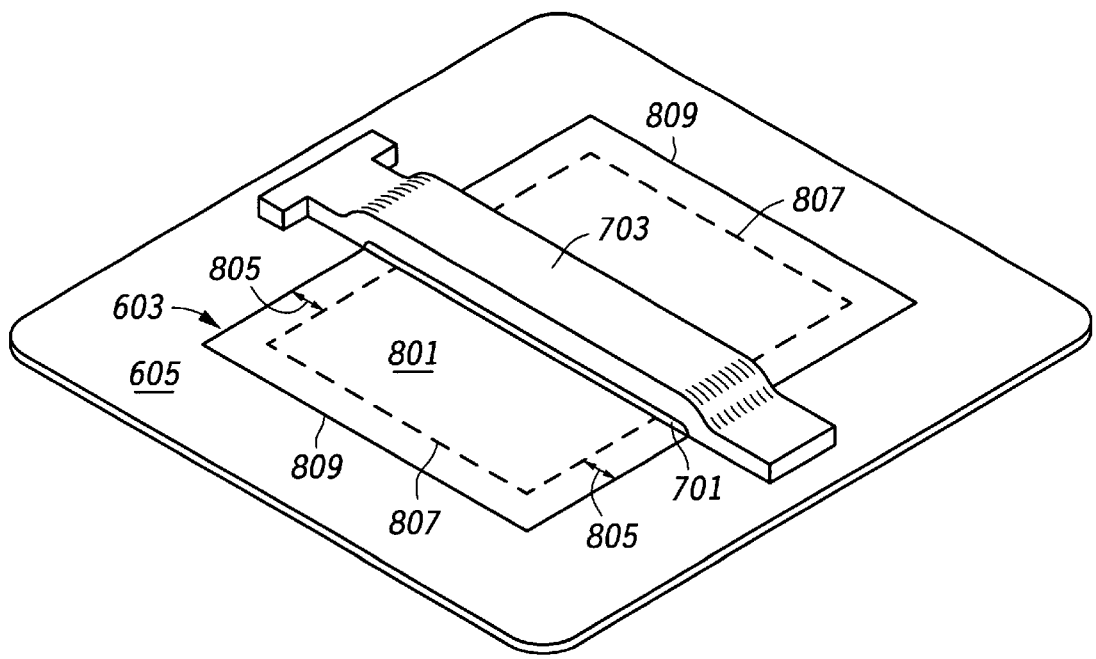
FIG. 9 illustrates a three-dimensional representation of a gate over an active area formed in accordance with the present invention.

FIG. 8 illustrates the transistors 721 and 723, depicting the transistor's widths, as opposed to FIG. 7, which illustrated transistors 721 and 723 depicting their lengths. The view of FIG. 8 is better understood with respect to FIG. 9. Specifically, FIG. 9 illustrates the gate electrode 703 and the gate dielectric 701 formed over the active region 603 in accordance with the present invention. The dashed outline 807 represents the surface dimension of an active region formed using previous methods. The specific embodiment illustrated results in an increased dimension 805 along each edge of the active region.

The dimension 805 translates to additional channel length under the gate 703. This increase in channel length accommodates increased electron flow from source to drain regions when the channel associated with the transistor illustrated is on. Therefore, the present invention results in increased current through the transistor 723. Therefore, as a result of the tapered isolation regions, a greater amount of active region is available at the surface of the semiconductor device using the same amount of silicon area as the prior art, which utilized either a non-tapered isolation region or an isolation region which tapered in the opposite direction.

Figure 10:
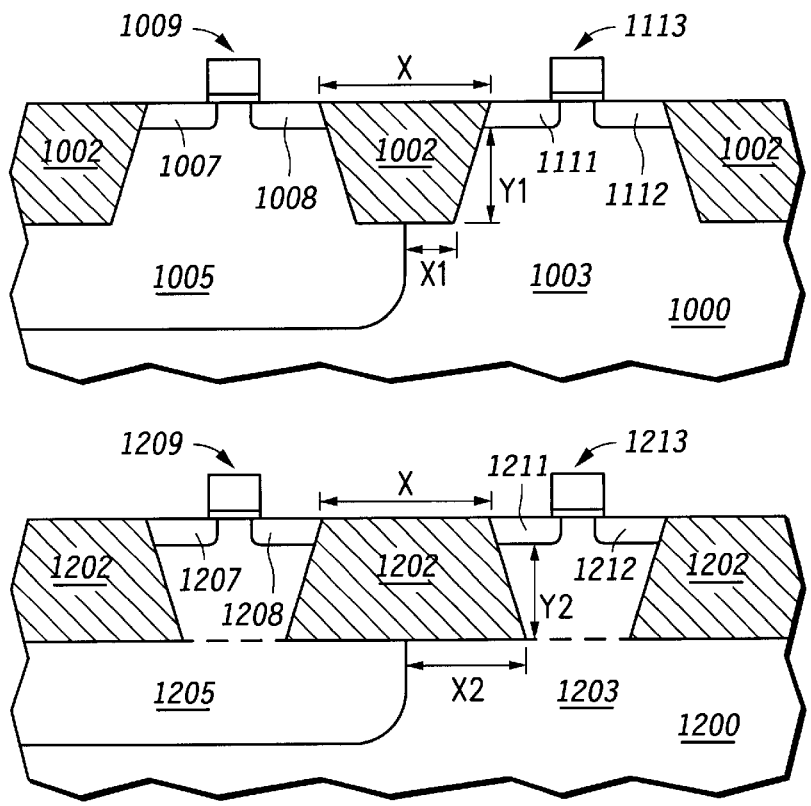
FIG. 10 illustrates, in cross section, an isolation region in accordance with the present invention and previously known isolation regions.

FIG. 10 illustrates a prior art structure 1000, and a structure 1200 in accordance with the present invention. Referring to the structure 1000, the leakage path between the well 1005 and the junction of doped region 1111 includes the Y1 distance from the junction of doped region 1111 and the bottom of the isolation region 1002, or less if current flows along the sidewall of the isolation region, and the X1 distance between the edge of the well 1005 and the rightmost edge of the isolation region 1002. The tapered isolation regions associated with the proposed invention result in a significantly greater X2 distance as opposed to the X1 distance of the prior art. In addition, the Y2 distance may be greater than the Y1 distance.

Another advantage of the present invention is illustrated with respect to subsequent processing shrinks of the structure 1000 versus the structure 1200. When the structure 1000 is shrunk in the lateral direction, it must also shrink in the vertical direction in order to maintain the aspect ratio of the isolation regions, thereby avoiding the formation of keyholes. However, with respect to the structure 1200, formed in accordance with the present invention, no such aspect ratio requirement is necessary due to the filling of the opening using epitaxial growth methods. Therefore, the present invention allows for greater flexibility and scaling over the prior art, as well as increased performance over devices formed by the prior art.

Figure 12:
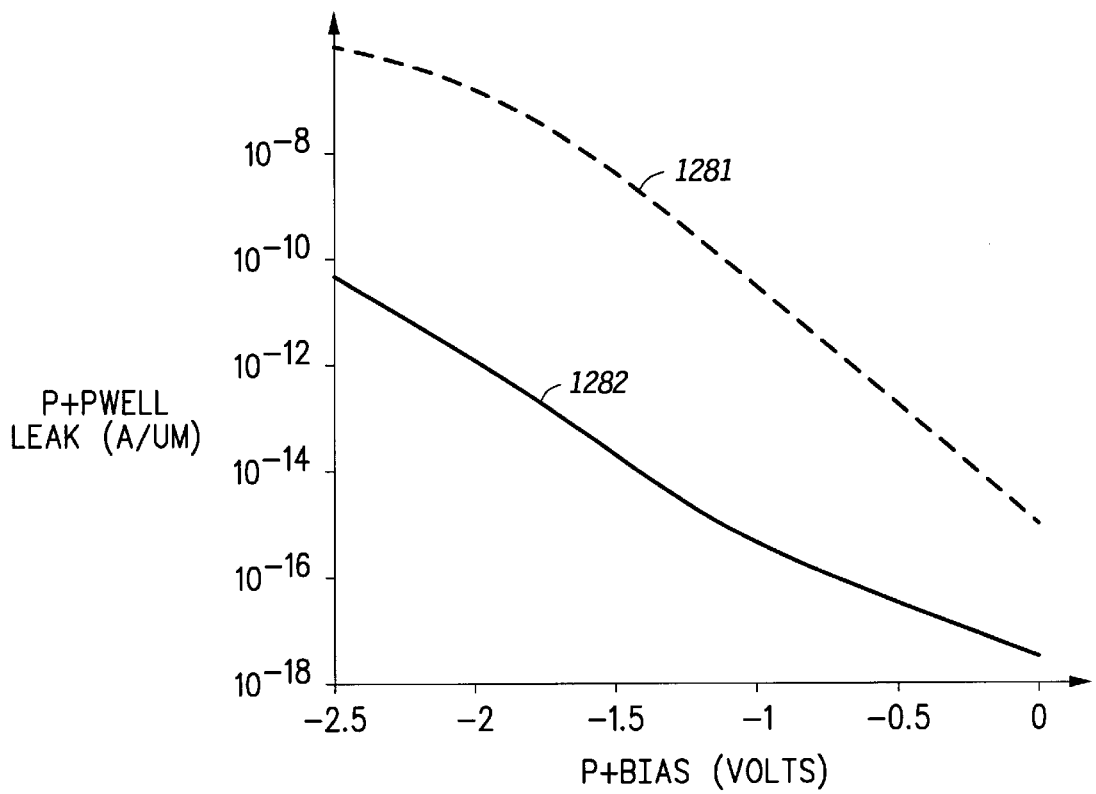
Figure 13:
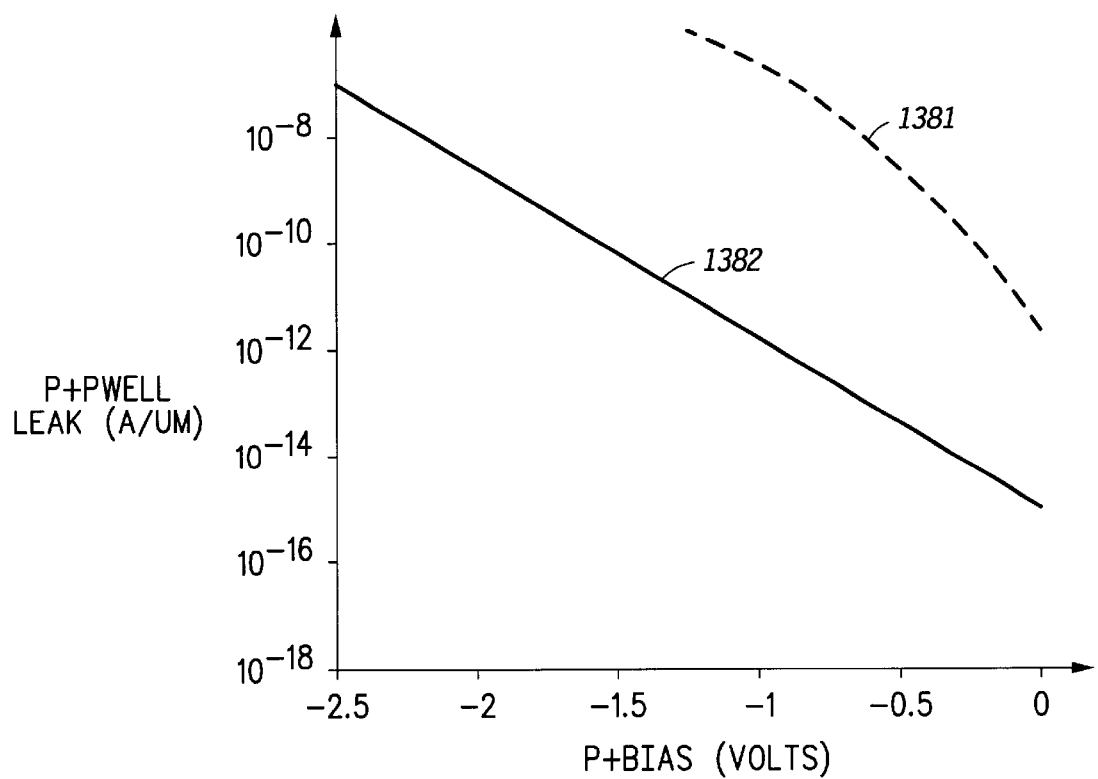

FIGS. 11–13 show simulated leakage results using isolation schemes associated with the prior art as compared to the isolation schemes associated with the present invention. The curves of FIGS. 11–13 compare the leakage between the P+ doped region (1111 or 1112) and P-well (1005 or 1205) for the prior art isolation structure 1002 and a present invention isolation structure 1202, both having an isolation dimension X as shown in FIG. 10. As illustrated in FIG. 11, for an isolation width of X=0.45 micrometers, and for a −1 volt bias level on doped region 1111, the prior art curve 1181 has an expected leakage current of approximately $10^{-14}$ amps per micrometer of width. Conversely, at a −1 Volt bias level, the leakage current expected with the present invention's curve 1182 is approximately $10^{-17}$ amps per micrometer of width. Therefore, the present invention would realize an improvement of approximately 3 orders of magnitude in leakage current. Further improvement would be expected where the well resides within the grown epitaxial region.

FIGS. 11 and 13 illustrate similar prior art and present invention leakage comparisons for isolation structures having isolation widths of X=0.35 micrometers and X=0.25 micrometers respectively. In FIG. 12, the leakage for the prior art structure is represented by curve 1281 and the leakage for the present invention's structure is represented by curve 1282. In FIG. 13, the leakage for the prior art structure is represented by curve 1381 and the leakage for the present invention's structure is represented by curve 1382. Therefore, as indicated by these simulation results for a bias level of −1 Volt, improvements in leakage of 3 to 5 orders of magnitude can be expected.

Figure 14:
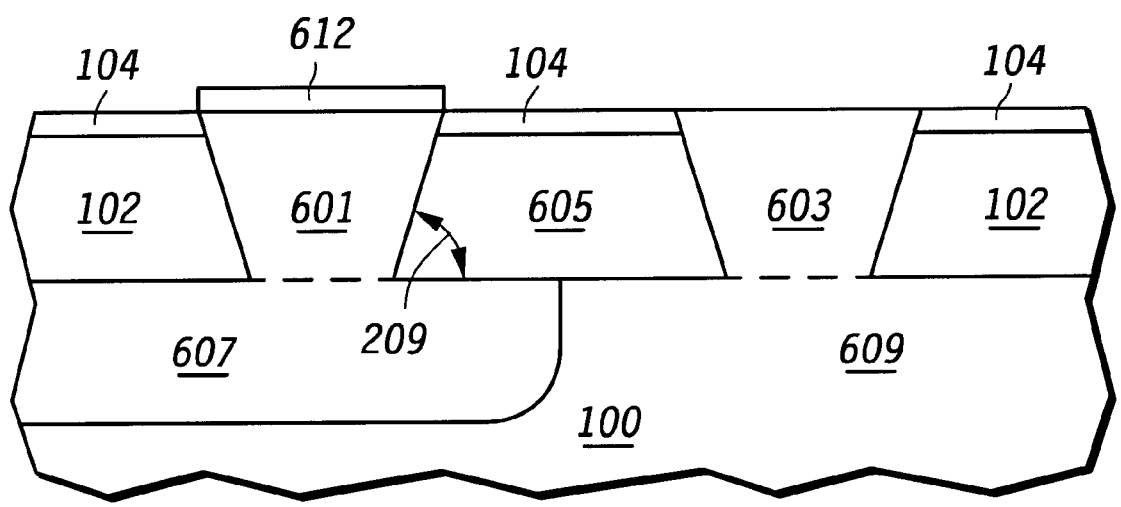
FIG. 14 illustrates, in cross section, an isolation region having a strained epitaxial layer.

FIG. 14 illustrates an embodiment of the present invention where a strained layer has been formed over region 601. Strained Si layers are generally used to increase the mobility of both electrons and holes for N- and P-channel transistor. Strained SiGe is used to increase the mobility of holes in P-channel transistors to more closely match the mobility of N-channel transistors. Strained layers are formed by forming a junction between one semiconductor material and a layer that is a composite semiconductor material. In one embodiment where region 601 is silicon, the strained layer 612 can be silicon-germanium. In another embodiment, where region 601 is silicon-germanium, the strained layer 612 can be silicon.

It should now be appreciated that the present invention discloses a structure and method for improving the leakage currents between junctions and their adjacent wells. In addition, the process has improved scalability, allowing for increased current drive without increasing surface area.

Although the invention has been described with respect to specific conductivity types or polarity of potentials, it should be understood that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A method for forming a semiconductor device comprising:

forming a dielectric layer over a semiconductor substrate, wherein the dielectric layer has an upper surface opposite the semiconductor substrate and a bottom surface toward the semiconductor substrate;

forming a first opening in the dielectric layer, wherein the first opening exposes a first portion of the semiconductor substrate, and wherein the first opening has a first dimension at the upper surface and a second dimension at the bottom surface, the first dimension being greater than the second dimension;

forming a first semiconductor material within the first opening; and removing portions of the first semiconductor material not contained within the first opening to form a first semiconductor region.

2. The method of claim 1 further comprising:

forming a second opening in the dielectric layer adjacent the first opening, wherein the second opening exposes a second portion of the semiconductor substrate, and wherein the second opening has a third dimension at the upper Surface and a forth dimension at the bottom surface, the third dimension being greater than the second dimension;

forming a second semiconductor material within the second opening; and removing portions of the second semiconductor material not contained within the second opening to form a second semiconductor region apart from the first semiconductor region, wherein the first semiconductor region and the second semiconductor region are separated by an isolation region that includes portions of the dielectric layer, the isolation region having a first isolation width dimension opposite the semiconductor substrate and a second isolation width dimension adjacent the semiconductor substrate, the second isolation width dimension being greater than the first isolation width dimension.

3. The method of claim 2, wherein the first semiconductor region includes a first-type dopant and the second semiconductor region includes a second-type dopant, the first-type dopant being opposite the second-type dopant.

4. The method of claim 2, wherein the first semiconductor region is further characterized as an epitaxially grown silicon region and forms a portion of P-channel region of a first semiconductor device, and wherein the second semiconductor region is further characterized as an epitaxially grown silicon-germanium region and forms a portion of an N-channel region of a second semiconductor device.

5. The method of claim 4, further comprising forming an epitaxially grown strained silicon layer over the epitaxially grown silicon-germanium region.

6. The method of claim 4, further comprising forming an epitaxially grown strained silicon-germanium layer over the epitaxially grown silicon region.

7. The method of claim 2, wherein the isolation region having a first isolation width dimension opposite the semiconductor substrate and a second isolation width dimension adjacent the semiconductor substrate produces an isolation region having tapered sidewalls.

8. The method of claim 7, wherein tapered sidewalls are angled in a range of approximately 60–80 degrees relative to a primary surface of the semiconductor substrate.

9. The method of claim 1, wherein the semiconductor substrate includes monocrystalline silicon, and wherein the first semiconductor material includes epitaxially grown silicon.

10. The method of claim 1, wherein forming a dielectric layer further comprises:

forming a first dielectric film over the semiconductor substrate;

forming an etch stop film over the first dielectric film; and forming a second dielectric film over the etch stop film.

11. The method of claim 10, wherein:

the first and second dielectric film include a silicon oxide material; and the etch stop film includes a material selected from the group consisting of silicon nitride and aluminum oxide.

12. The method of claim 10 further comprising removing portions of the second dielectric film over the etch stop film prior to removing portions of the first semiconductor material not contained within the first opening to form a first semiconductor region.

13. The method of claim 1, wherein the semiconductor substrate and the first semiconductor material include a material selected from the group consisting of gallium nitride, gallium arsenide, indium gallium arsenide, and indium phosphide.

14. A method of forming a semiconductor device, the method comprising the steps of:

forming an isolation region on a substrate between a first active area and a second active area, the isolation region including a first sidewall portion immediately adjacent to the first active area, and a second sidewall portion immediately adjacent to the second active area and opposite the first sidewall portion;

forming a well region of a first polarity type below the first active area; and forming a doped region of the first polarity type in the second active area, wherein for an absolute voltage bias value of 1 volt between the well region and the doped region results in a leakage current of less than approximately $1\times10^{-14}$ amps per micrometer.

15. The method of claim 14, wherein the step of forming the isolation region includes the first active area and the second active area being substantially comprised of silicon.

16. The method of claim 14, wherein the step of forming the isolation region includes forming the well region at least partially under the isolation region.

17. The method of claim 14, wherein the doped region is formed immediately adjacent to the first sidewall portion, and the well region is formed immediately adjacent to the second sidewall portion, wherein a distance of approximately X separates at least a portion of the well region from at least a portion of the doped region.

18. The method of claim 14, wherein the doped region is at least one of a P-doped well region of an N-channel transistor and an N-doped well region of a P-channel transistor.

19. The method of claim 14, wherein the isolation region is a tapered isolation region wherein a portion of the isolation region near the surface has a greater width dimension than a portion of the isolation region near a primary surface of the substrate.

20. The method of claim 14, wherein a dimension X separates the first sidewall portion form the second sidewall portion near a surface of the isolation region and X is less than 0.45 micrometers.

* * * * *